United States Patent [19]

Srivastava et al.

[11] Patent Number: 5,433,917
[45] Date of Patent: Jul. 18, 1995

[54] PZT CERAMIC COMPOSITIONS HAVING REDUCED SINTERING TEMPERATURES AND PROCESS FOR PRODUCING SAME

[75] Inventors: Ashvin Srivastava, Bensalem; Amar Bhalla; L. Eric Cross, both of State College, all of Pa.

[73] Assignee: The Penn State Research Foundation, University Park, Pa.

[21] Appl. No.: 121,840

[22] Filed: Sep. 16, 1993

[51] Int. Cl.6 ................................................ B22F 3/10
[52] U.S. Cl. ........................................ 419/22; 419/10; 419/19; 419/32; 419/46
[58] Field of Search .............................. 419/5, 8, 9, 22; 501/134, 135, 136, 137, 138; 264/56, 63, 64, 65

[56] References Cited

U.S. PATENT DOCUMENTS

| | | | |
|---|---|---|---|
| 4,222,885 | 9/1980 | Hennings et al. | 252/581 |
| 4,244,830 | 1/1981 | Hennings et al. | 501/138 |
| 4,255,272 | 3/1981 | Ogawa et al. | 252/62.9 |
| 4,511,483 | 4/1985 | Ogawa et al. | 252/62.9 |
| 4,607,314 | 8/1986 | Wada et al. | 361/321 |
| 4,764,494 | 8/1988 | Sakabe et al. | 501/138 |
| 5,164,882 | 11/1992 | Kanai et al. | 361/321 |
| 5,204,031 | 4/1993 | Watanabe et al. | 264/63 |

OTHER PUBLICATIONS

Cheng, S. Y., S. L. Fu, C. C. Wei and G. M. Ke, J. Mat. Sc., 21, 571 (1986).
Wittmer, D. E. and R. C. Buchanan, J. Amer. Ceramic Soc., 64, 485 (1981).
Takahashi, S., Jpn. J. Appl. Phys., 19, 771 (1980).
Ashby, M. F., Acta Metallurgica, vol. 22, Mar. 1974.
Kingery, W. D., "Introduction To Ceramics." pp. 947–953.
Jaffe, B. W. R. Cook Jr. and H. Jaffe, Piezoelectric Ceramics, p. 136.
Economos, G., in "Ceramic Fabrication Processes." W. D. Kingery, Ed., John Wiley & Sons, N.Y., 1958, p. 201.
Winnie Kwai Wong-Ng, K. L. Davis, R. S. Roth, J. of Am. Cer. Soc., 71 [2]C-64-C-67 (1988).
Moulson, A. J. and J. M. Herbert, in "Electrceramics," p. 280, Table 6.1.
Ikeda, T. J. Phys. Soc. Japan 14, 168–174, (1959).
Kulcsar, F. (1959). J. Am. Ceram. Soc. 42, 49-51.
Sakudo, T. J. Phys. Soc. Japan 12, 1050 (1957).
Hennings, D., Ber. Dt. Keram. Ges. 55, pp. 359–360 (1978) Nr. 7.
Burn, I., J. Mat. Science, vol. 17, (1982) pp. 1398–1408.

*Primary Examiner*—Donald P. Walsh
*Assistant Examiner*—John N. Greaves
*Attorney, Agent, or Firm*—Thomas J. Monahan

[57] ABSTRACT

Process for producing novel fluxed PZT dielectric ceramic compositions having sintering temperatures below about 1000°, so as to be non-reactive with electrode layers when co-fired therewith. The PZT is sintered with an effective amount of an eutectic mixture of CuO and an oxide of an alkaline earth metal, preferably barium oxide and/or strontium oxide, to reduce the sintering temperature of the PZT composition below about 1000° C. Dopant such as manganese oxide may be added to reduce the dielectric losses.

12 Claims, 14 Drawing Sheets

1

PZT CERAMIC COMPOSITIONS HAVING REDUCED SINTERING TEMPERATURES AND PROCESS FOR PRODUCING SAME

GOVERNMENT SPONSORSHIP

This invention was made with Government support under Grant N00014-89-J-1689 awarded by the U.S. Department of the Navy. The Government has certain rights in the invention.

BACKGROUND OF THE INVENTION

1. Field of the Invention

The present invention relates to lead zirconate titanate (PZT) dielectric ceramic compositions, such as for use as piezoelectric ceramic transducer materials. PZT is the best and most widely used piezoelectric ceramic transducer material. The use of lead zirconate titanate (PZT) in cofirable multilayered electrode devices for electromechanical applications has been hindered by its reactivity with metal electrodes at its normal sintering temperatures.

Piezoelectric transducers are replacing electrodynamic or electromagnetic based devices for use as electromechanical transducers since they can be made smaller, more efficient (less heat produced) and have quicker response times. PZT is the best and hence the most widely used piezoelectric ceramic transducer material. However, PZT based actuators need relatively large electric fields (500 to 2000 V/mm) for maximum deflections and therefore they cannot be used easily in electronics where voltages range from 5 to 15 Volts. The solution to this problem is to fabricate PZT actuators in a multilayered configuration, similar to multilayered capacitors, by making thin tape-cast PZT sheets which are coated with electrode inks made of silver-palladium or platinum and then laminated and cofired. However, before this process can be used effectively the sintering temperature of PZT must be reduced from 1300 C. to about 1000–1100 C. or less. At the normal PZT sintering temperatures the electrode-ceramic interactions are highly detrimental. These interactions occur especially due to the high volatility of PbO in PZT. The gradual decrease in weight is due to the lead loss at temperatures greater than 950–1000 C. Therefore it is highly desirable to produce PZT compositions having substantially-reduced sintering temperatures, such as between about 900°–950° C., while retaining a high dielectric constant and minimizing dielectric losses.

2. Discussion of the State of the Art

It is well known to add sintering aids such as metal oxide and fluoride compounds to piezoelectric ceramic compositions in order to reduce the sintering temperature, lower manufacturing costs and enable the use of lower-melting, less expensive electrode metals. Reference is made to Cheng, S. Y., S. L. Fu, C. C. Wei and G. M. Ke, J. Mat. Sc., 21, pp. 571–576 (1986); Wittmer, D. E. and R. C. Buchanan, J. Amer. Ceramic Soc., 64, pp. 485–490 (1981), and Hennings, D., Ber. Dt. Keram. Ges. 55, pp. 359–360 (1978) Nr. 7, and U.S. Pat. Nos. 4,222,885 and 4,244,830. Sintering additives which are effective in certain ceramic compositions, such as barium titanates, may not be effective in PZT ceramic and/or may cause substantial degradation of the dielectric properties. Also prior known sintering aids for PZT compositions, such as vanadium pentoxide, lithium carbonate, sodium carbonate, boron oxide, bismuth oxide, etc., are not completely satisfactory. The prior known fluxes or processing techniques for lowering the sintering temperature of PZT ceramics are either too processing intensive for commercialization or tend to deteriorate the electrical properties considerably.

For large scale, low cost commercial applications the use of sintering aids is most appropriate. Typical conventional sintering aids are oxides of metals such as Li, Na, B, V, Bi and Pb, or their fluorides. A liquid phase sintering aid is typically chosen due to its melting temperature, which should be such that there is a liquid phase present during the second stage of sintering. This liquid phase makes it easier for particle rearrangement and for material transport enabling rapid and enhanced low temperature sintering. For high dielectric constant (K) compositions it is preferred that no second phase exists, but if present the equivalent circuit should be such that it is in parallel and not in series with the major high K phase.

SUMMARY OF THE INVENTION

The present invention relates to the incorporation of novel sintering aids or additives into pure lead zirconium titanate (PZT) piezoelectric ceramic compositions to lower the sintering temperature of the PZT from its normal high temperature of about 1300° C. down to between about 900°–950° C., without the involvement of intensive processing steps and with little or no deterioration or degradation of the electrical properties of the PZT ceramic.

The present liquid phase sintering aids are eutectic mixtures or fluxes of copper and an alkaline earth or Group IIa metal, e.g., beryllium, magnesium, calcium, strontium and/or barium. Such eutectic mixtures are formed between oxides of copper and the Group IIa metal, most preferably barium and/or strontium, which are calcined together in stoichiometric proportions at a sufficient elevated temperature to form the eutectic, such as barium cuprate (xBaOyCuO). Barium cuprate (BC) has been found to be a most effective sintering aid for lowering the sintering temperature of PZT to between 900° and 950° C. when added thereto in optimum amounts between about 2 and 4 wt %, with no noticeable change in the dielectric constant or loss. Microstructural analysis indicates that the residual flux segregates out as a second phase.

THE DRAWINGS

Figure 5:
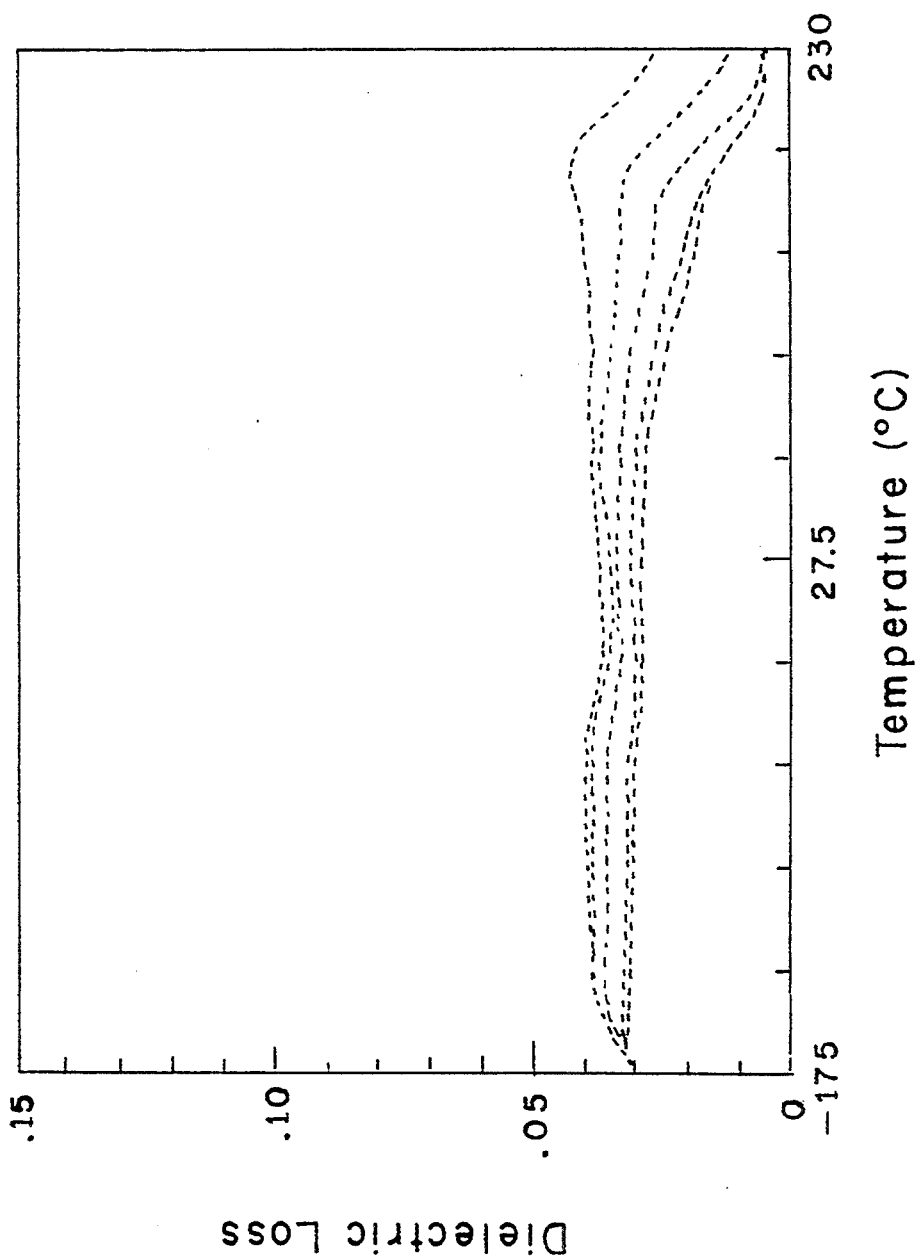
Figure 6:
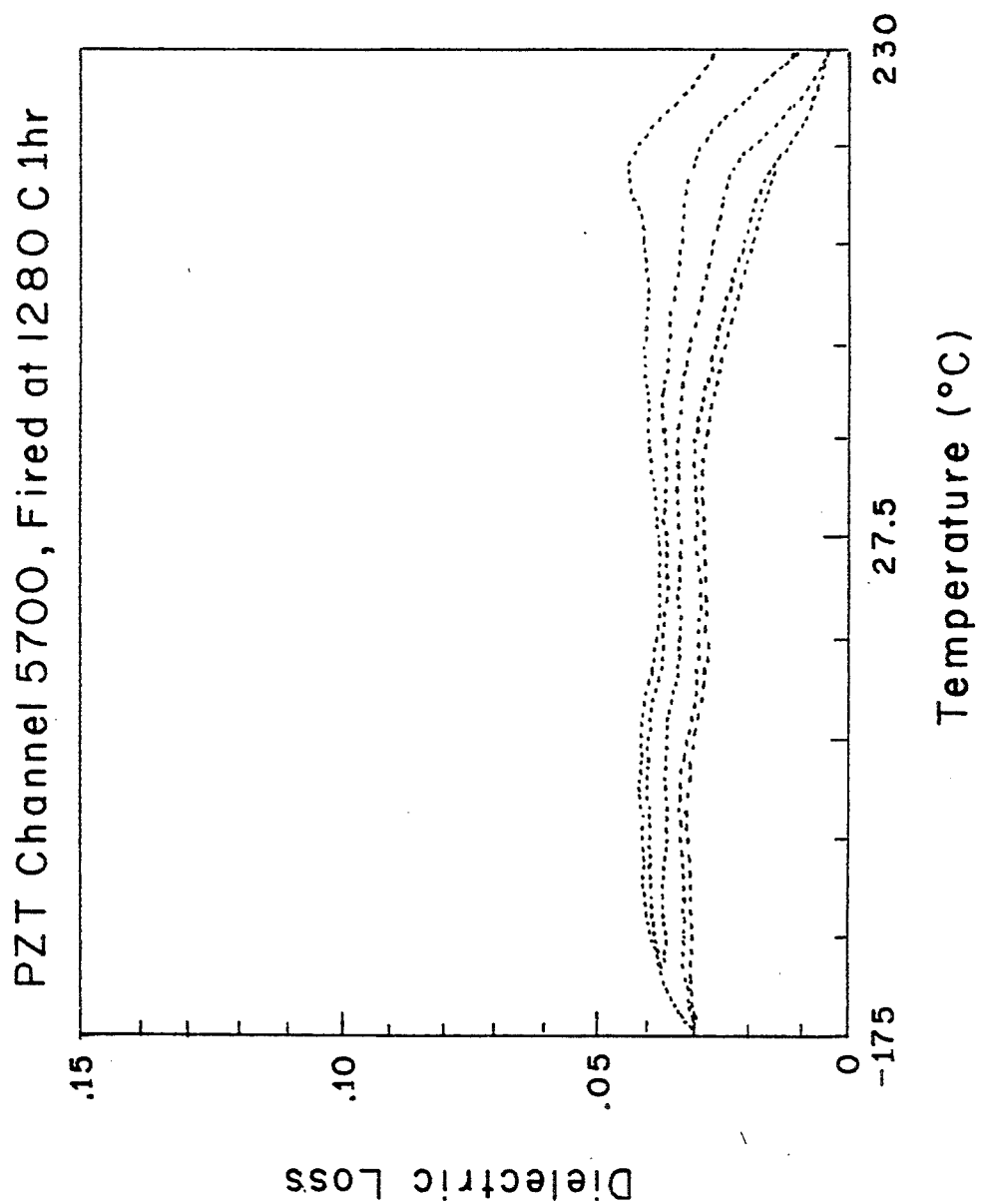
Figure 7:
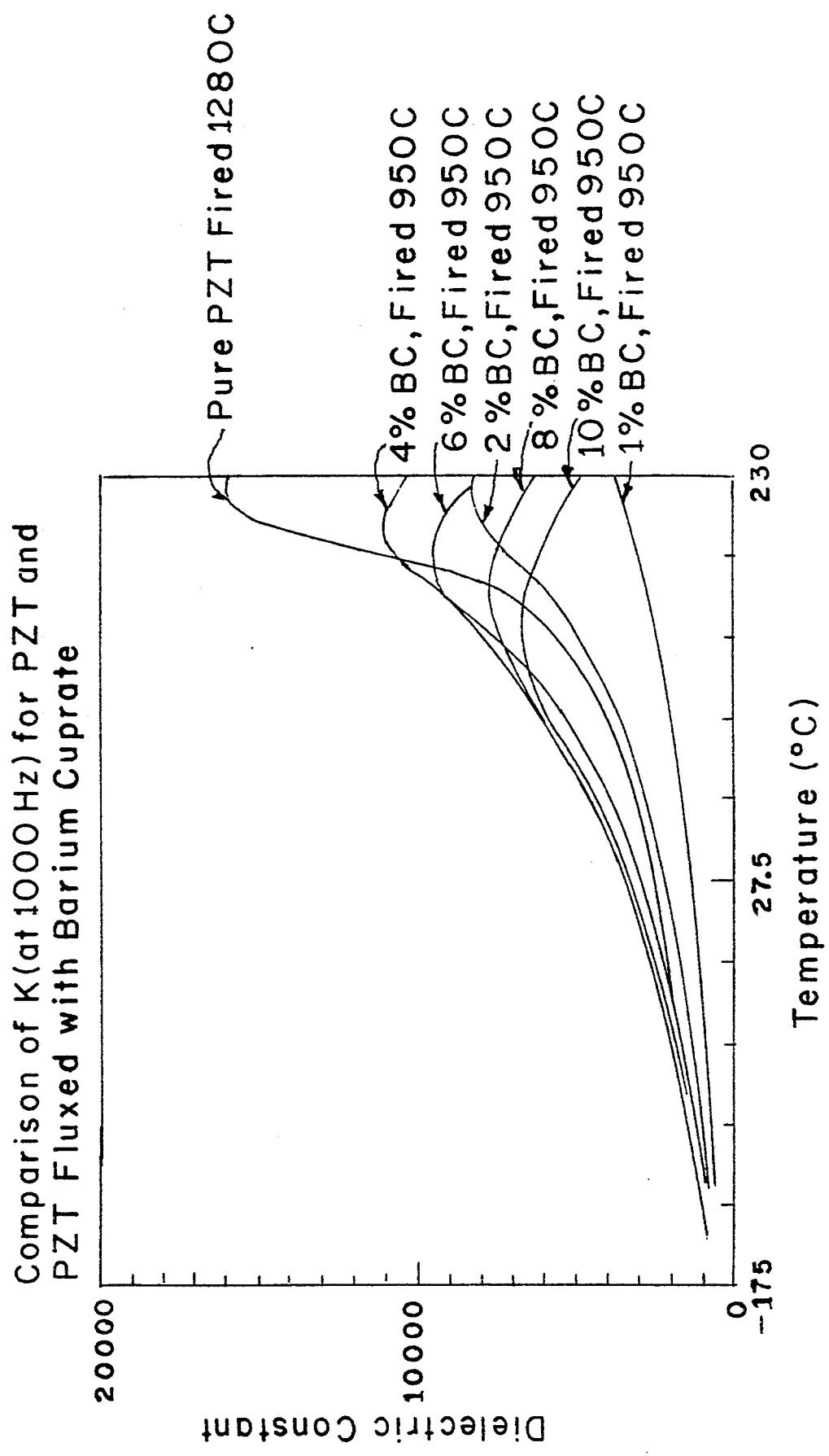
Figure 8:
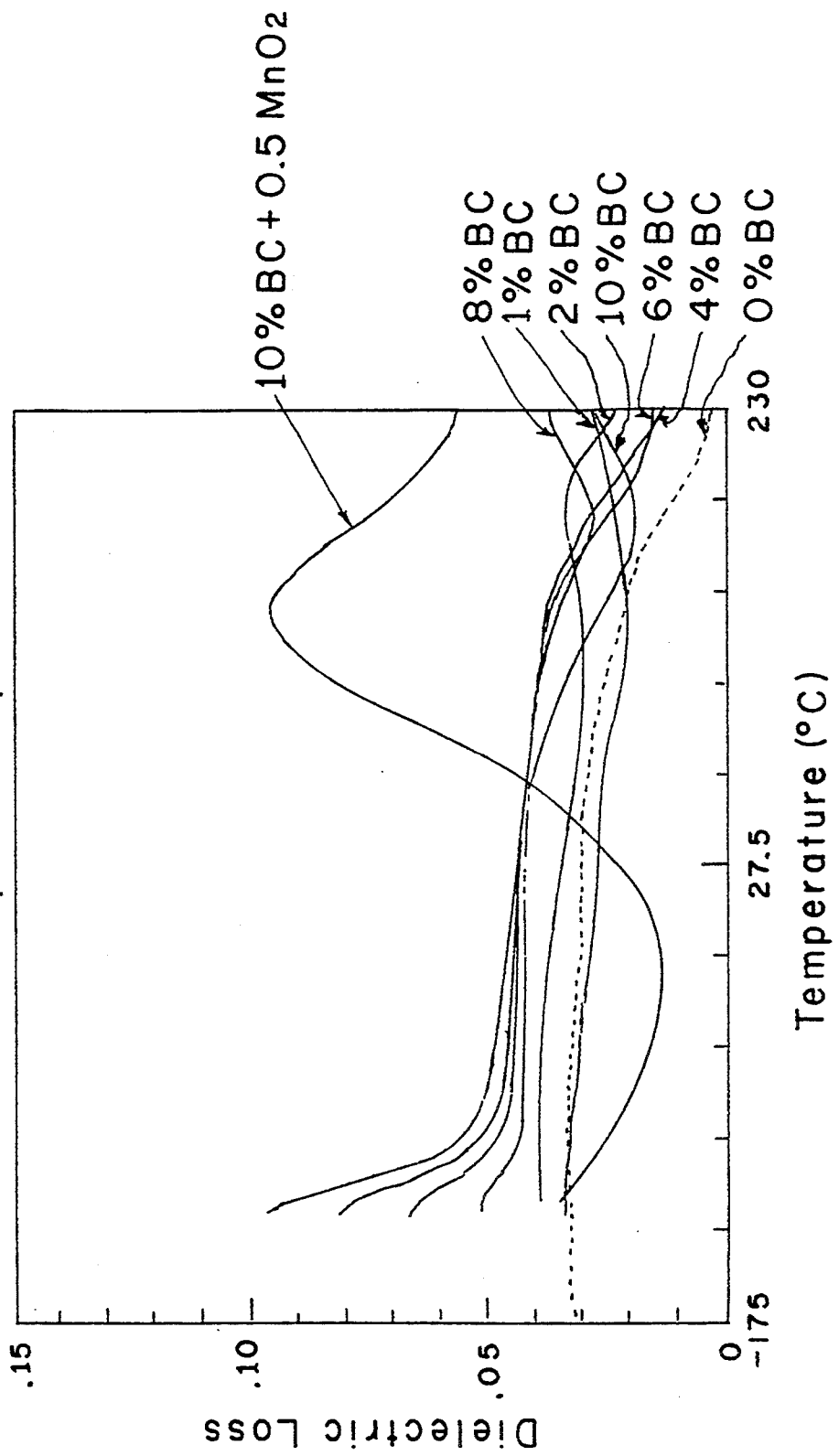
Figure 9:
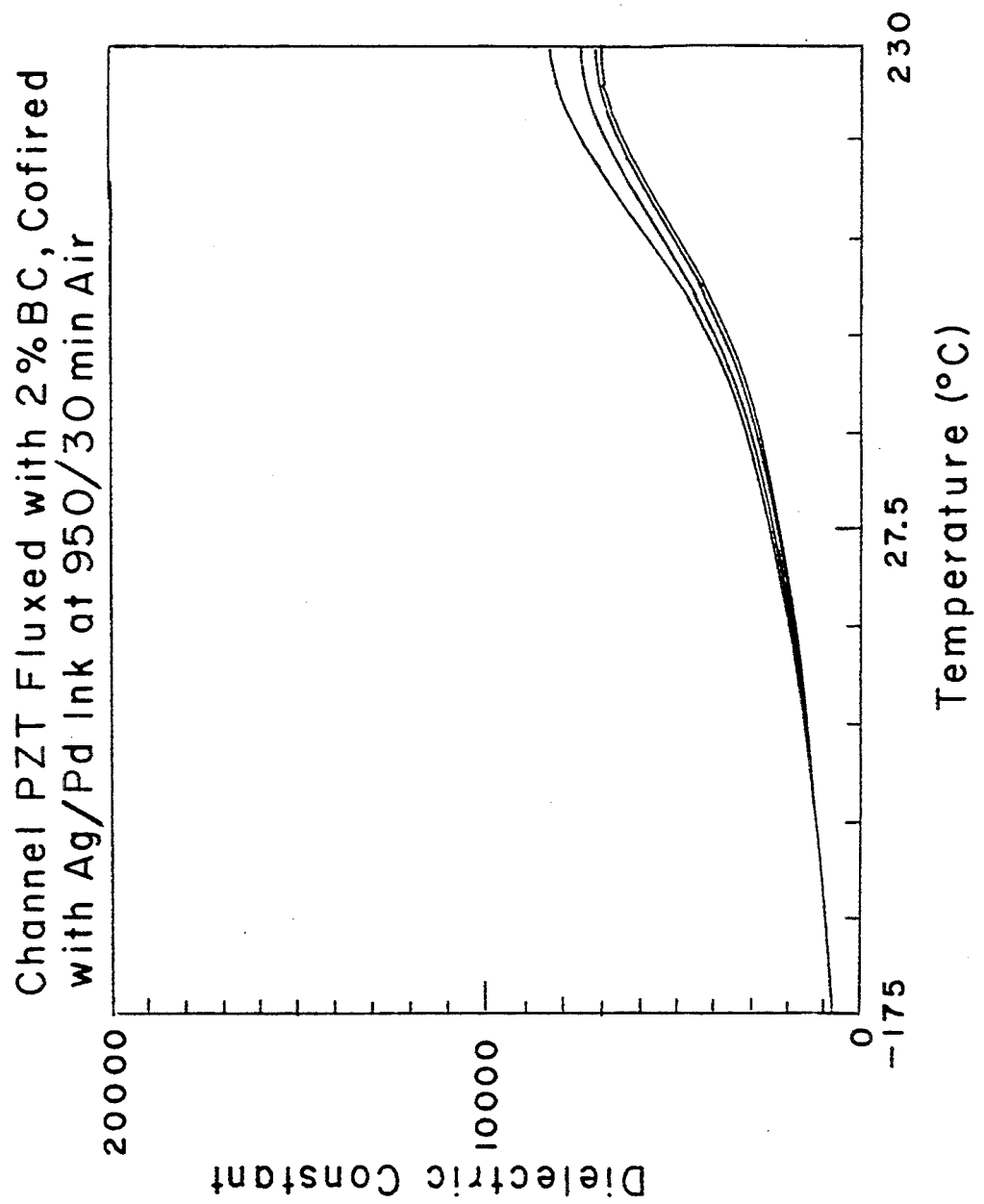
Figure 10:
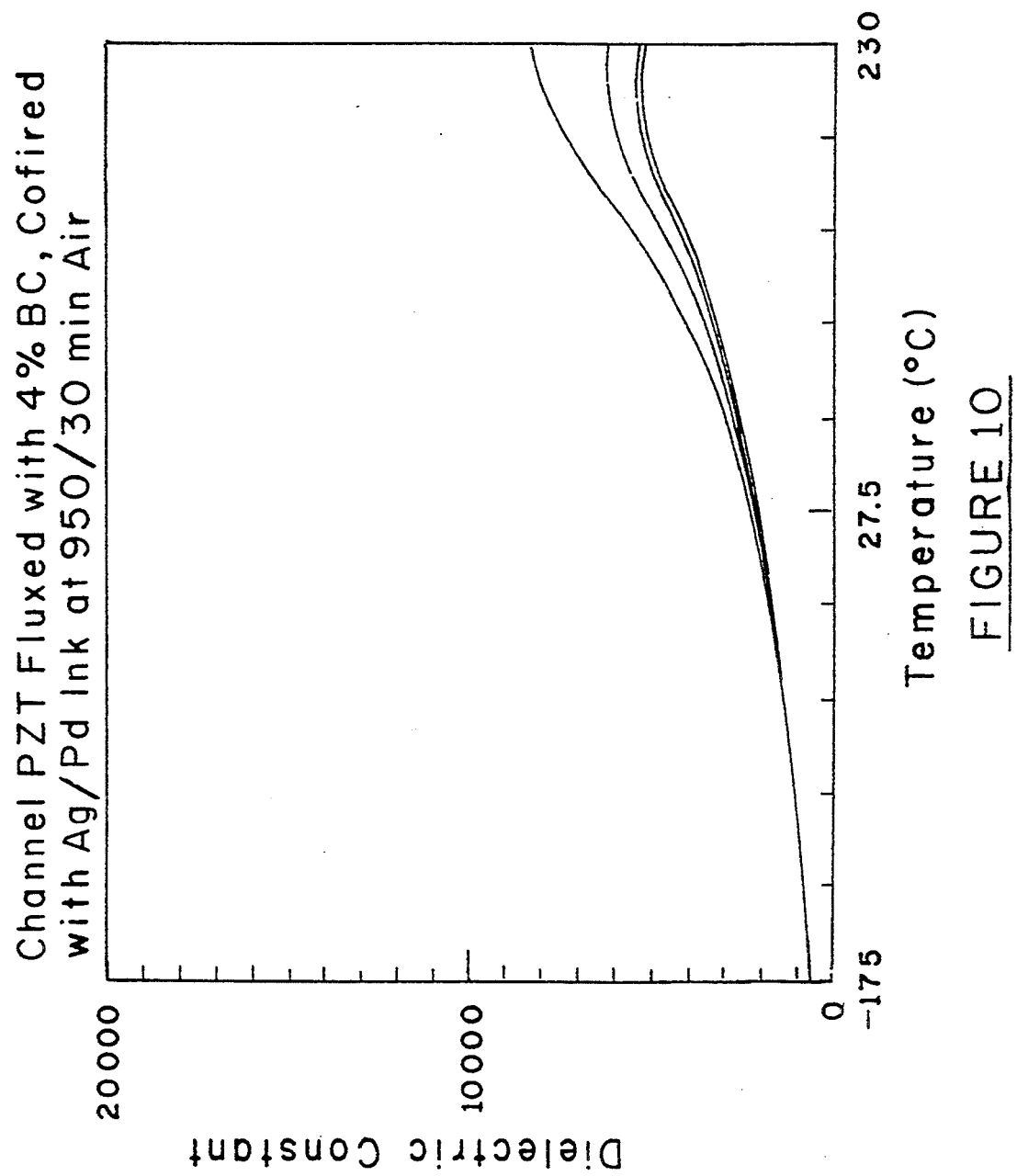
Figure 11:
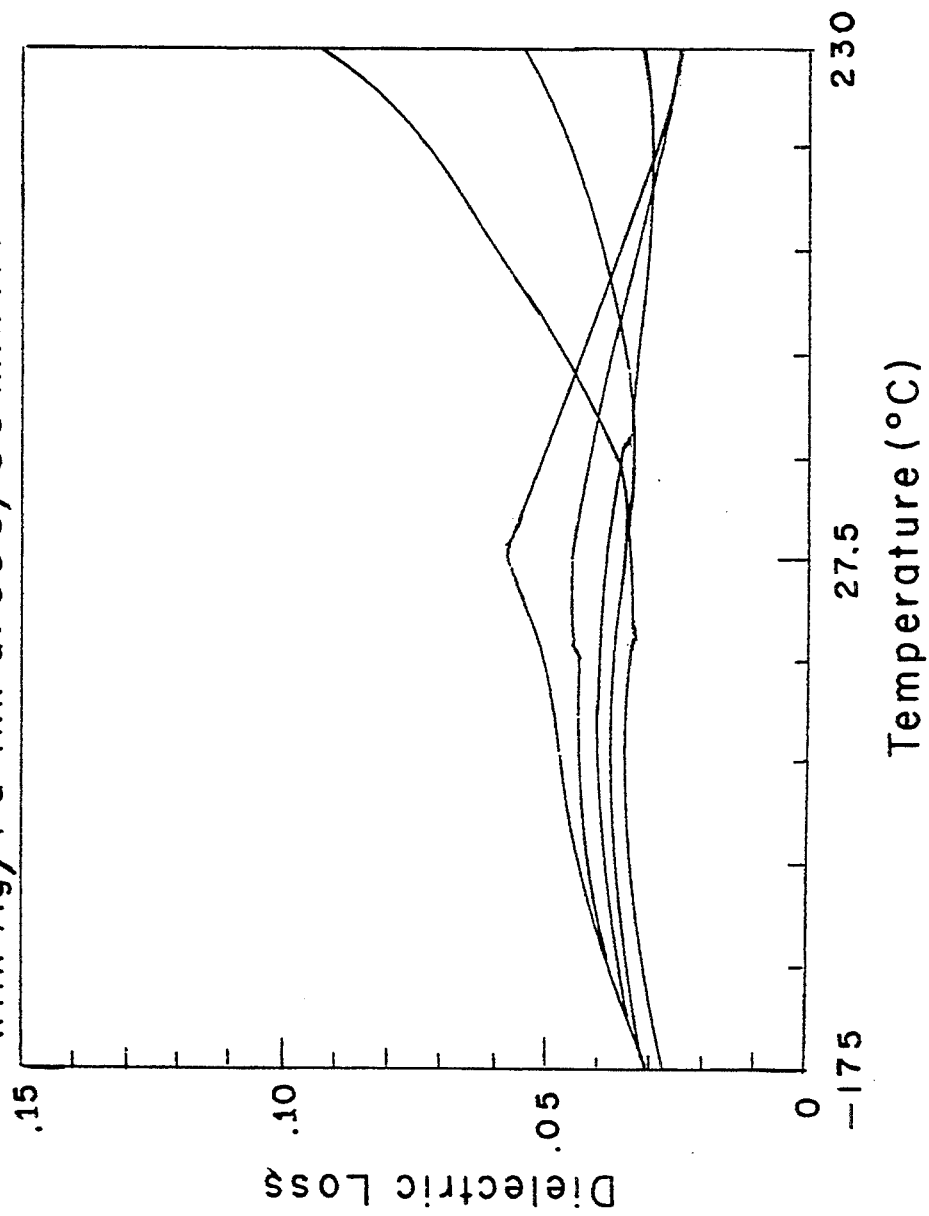
Figure 12:
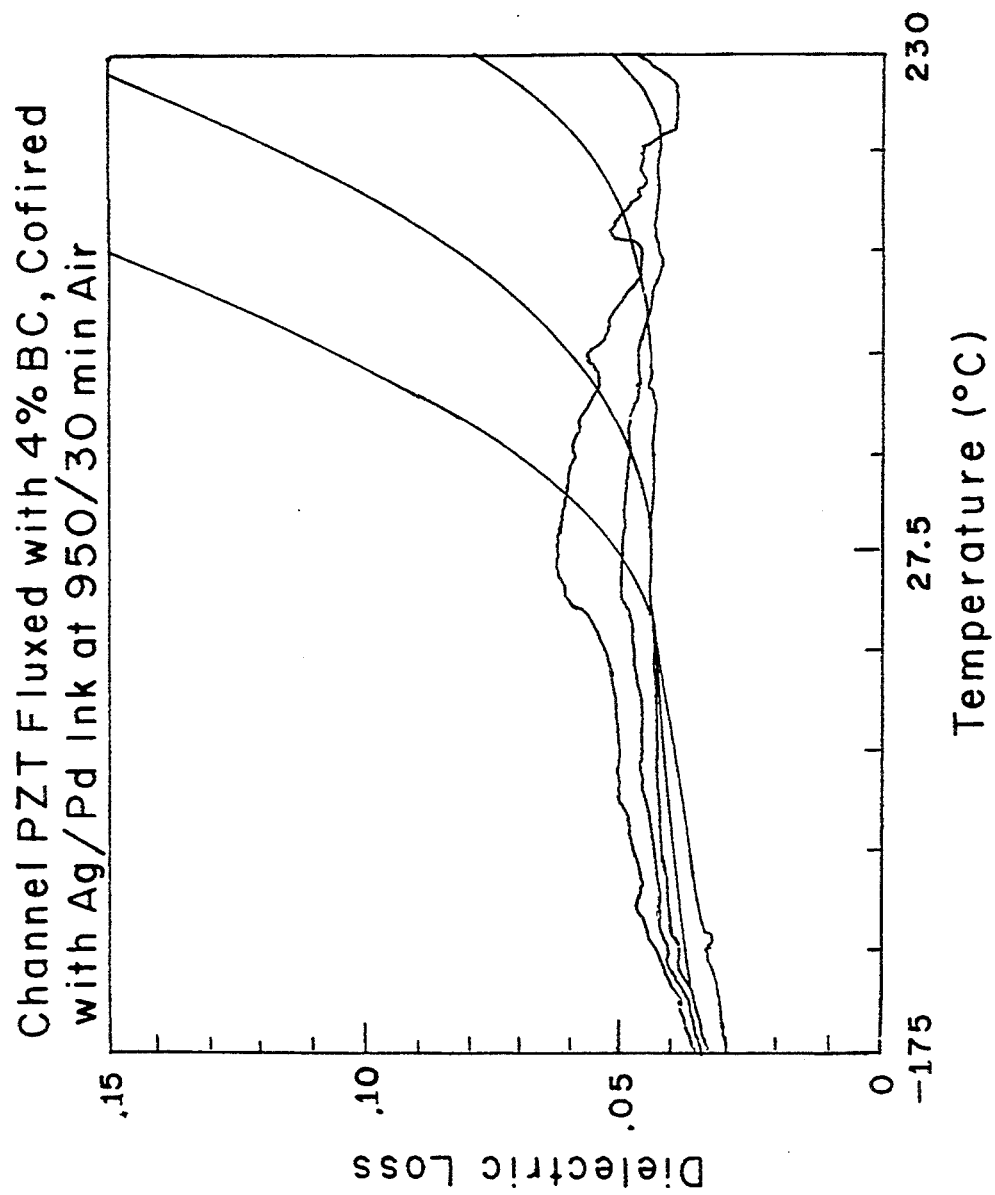
Figure 13:
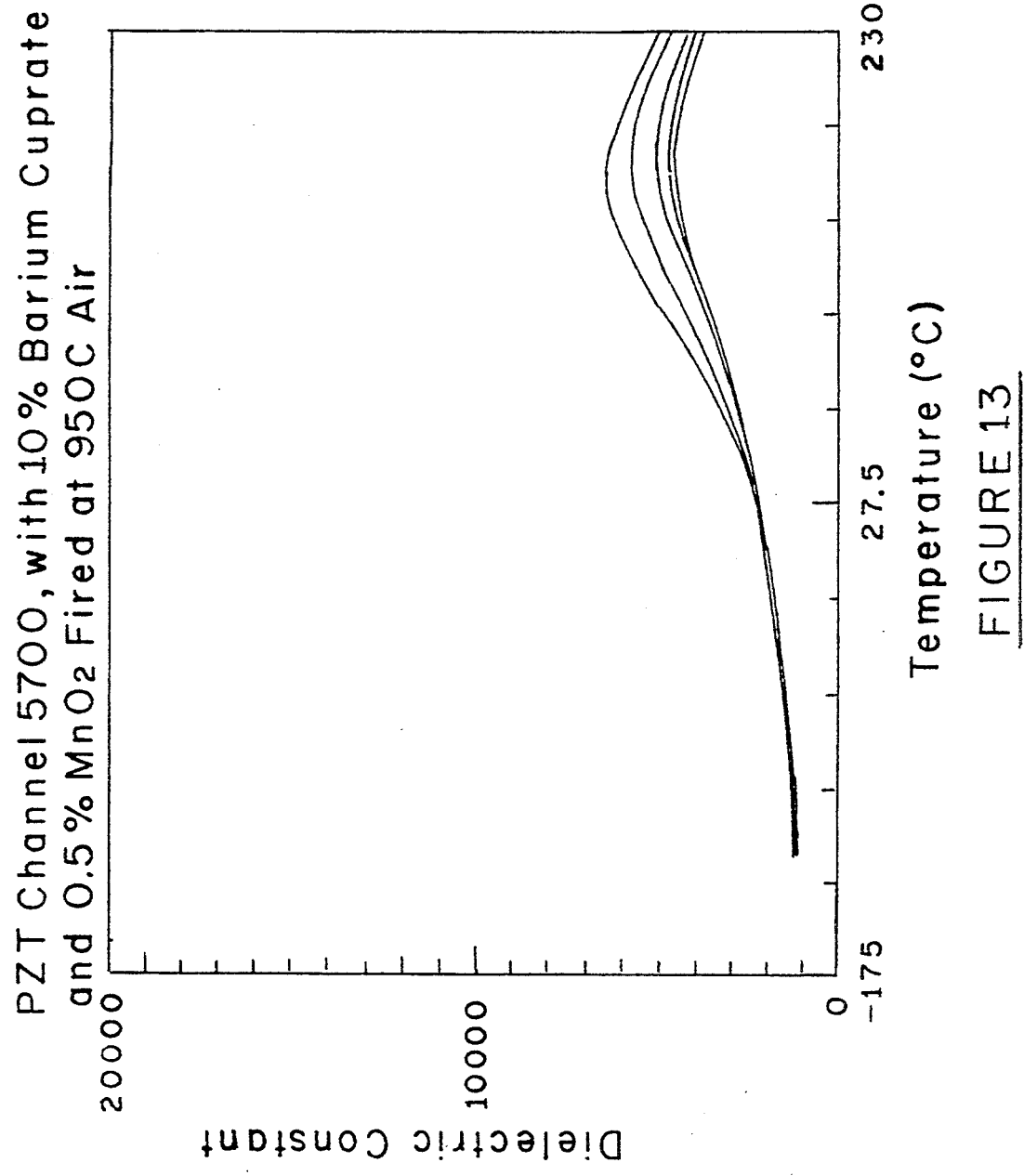
Figure 14:
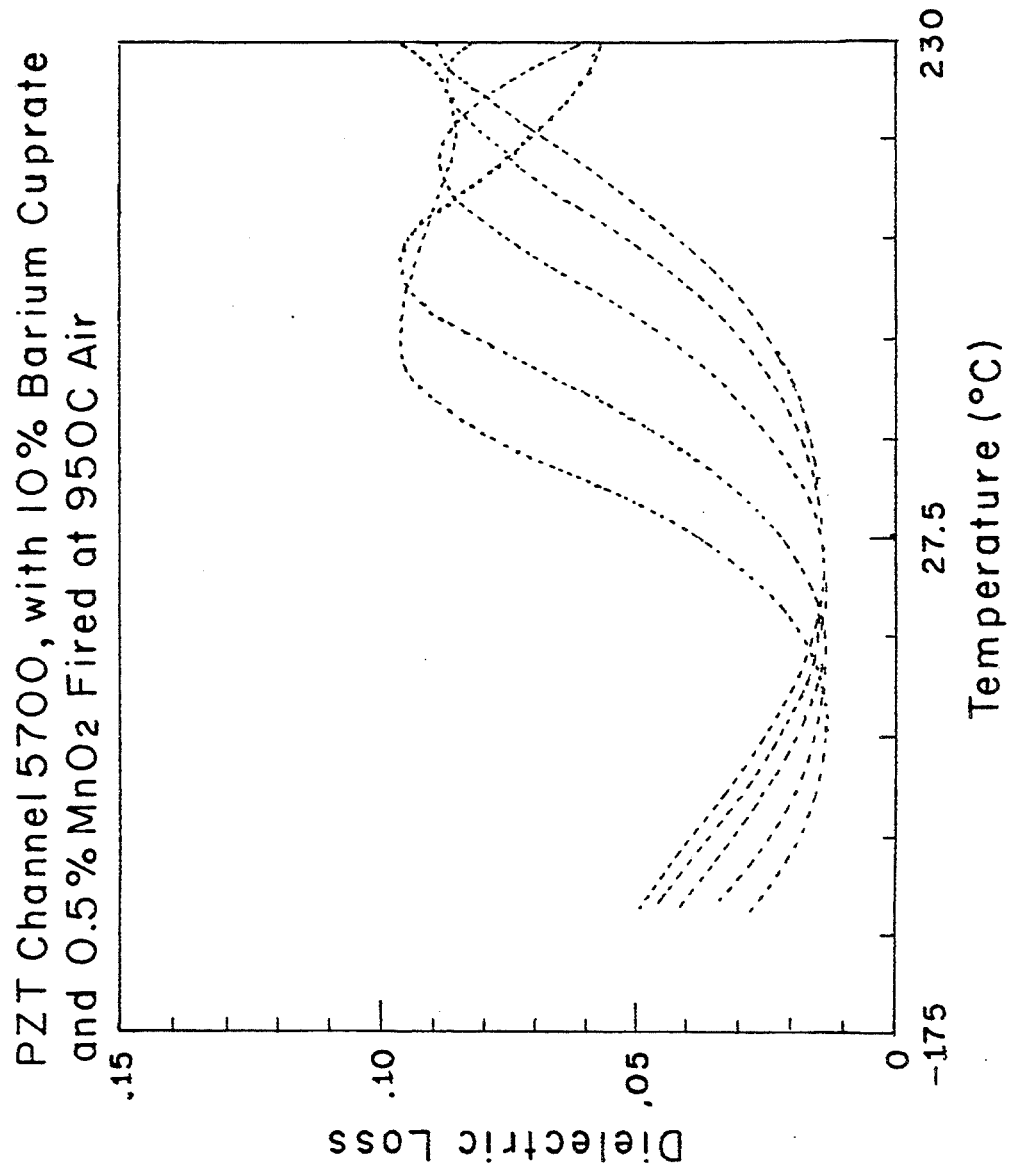

FIGS. 5 and 6 are dielectric constant and dielectric loss graphs, respectively, illustrating these respective values for an unfluxed PZT ceramic composition fired at 1280° C. for 1 hour and measured between −175° C. and 230° C. at five frequencies;

FIGS. 7 and 8 are dielectric constant and dielectric loss graphs, respectively, illustrating the curves for these respective values for an unfluxed PZT ceramic, fired at 1280° C. for 1 hour, as compared to the respective values for six fluxed PZT compositions fired at 950° C. for 1 hour;

FIGS. 9 and 10 are dielectric constant curves for fired electroded samples of PZT ceramics containing 2% and 4%, respectively, of the present eutectic fluxing agents;

FIGS. 11 and 12 are dielectric loss curves for fired electroded samples of PZT ceramics containing 2% and 4%, respectively, of the present eutectic fluxing agents; and FIGS. 13 and 14 are dielectric constant and dielectric loss curves, respectively, for fluxed, doped PZT ceramic compositions containing 10% barium cuprate eutectic and 0.5% manganese oxide dopant, fired at 950° C. for 10 hours.

The present eutectic flux may be prepared using a conventional oxide mix technique. The stoichiometric mixture of the group IIa metal oxide, such as BaO, and CuO are wet mixed with ethyl alcohol in a mill for eight hours. The wet mixture is then dried at 80° C., and then calcined at 840° C. for four hours.

The present barium cuprate flux was tested on the following PZT compositions:
  (a) A morphotropic phase boundary composition consisting of 52% $PbOZrO_2$-48% $PbOTiO_2$, calcined at 950 C., and
  (b) A commercial sample of unfluxed PZT purchased from Channel Industries. This composition is a soft PZT modified with $Sr^{+2}$ (1.42%), $La^{+3}$ (2.23%), $Nb^{+5}$ (1.0%), calcined at 950 C. All fabrication was done by standard conventional preparation techniques.

TGA, DTA and dilatometry were done to study the weight loss, melting characteristics of flux/fluxed PZT and the shrinkage behavior of PZT as a function of flux additions. The dielectric measurements were done as a function of temperature and frequency. The $d_{33}$ measurements were done on samples poled at 80° C., 30 kV/cm for 30 minutes, using a Berlincourt meter.

Figure 1:
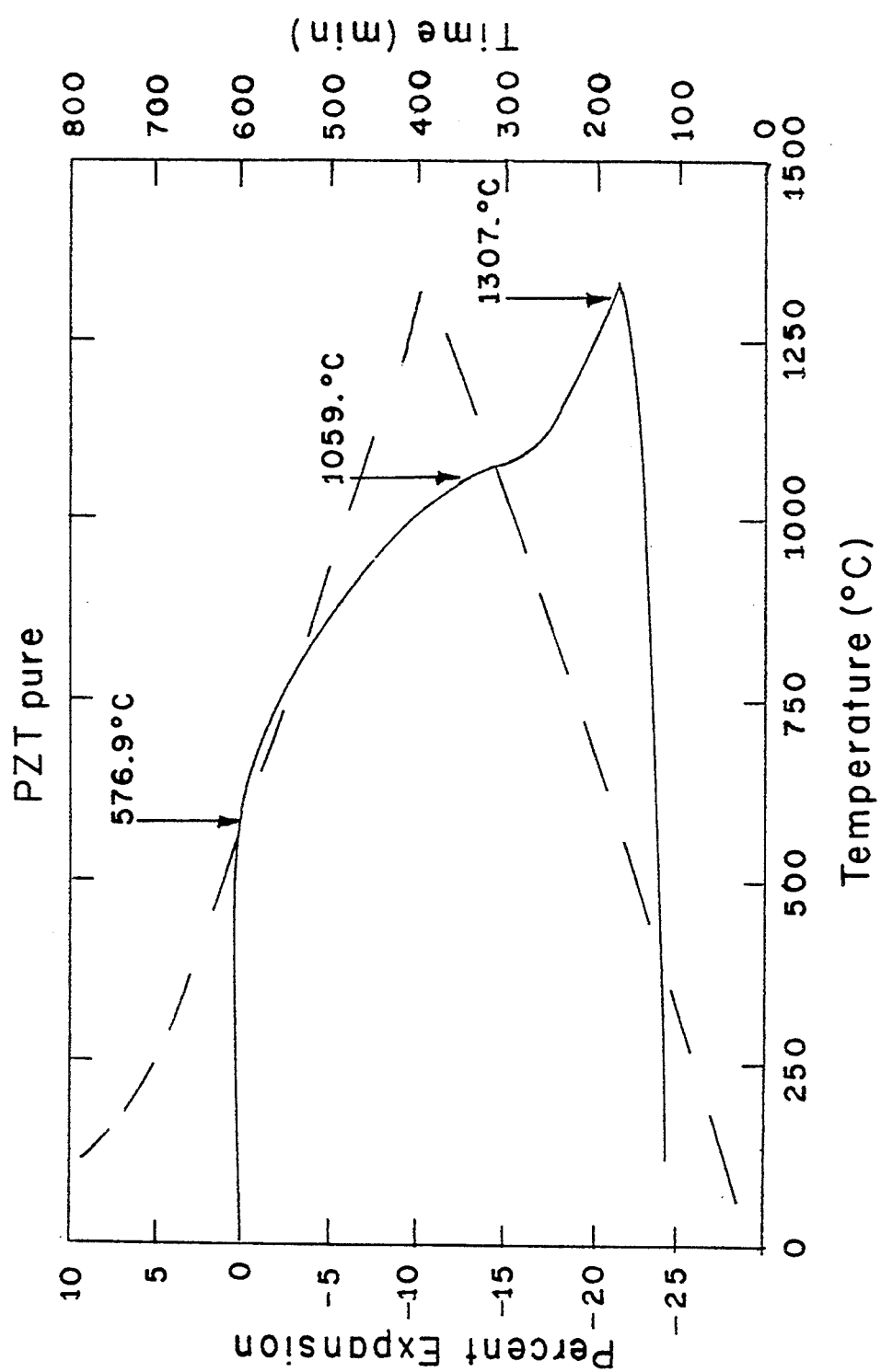
FIG. 1 is a curve graph illustrating the shrinkage behavior or sintering behavior for unfluxed soft PZT over a temperature range up to about 1310° C.

The shrinkage curve obtained from a dilatometer gives a good indication of the sintering behavior of a particular material assuming all other variables such as particle size, fabrication techniques, firing atmospheres, etc., are constant. The typical shrinkage curve for the unfluxed soft PZT is shown in FIG. 1. The densification begins around 700° C. and is gradual up to 1060° C. after which there is rapid shrinkage, possibly due to the volatalization of PbO. The shrinkage on sintering up to about 1310° C. is about 25%.

Figure 2:
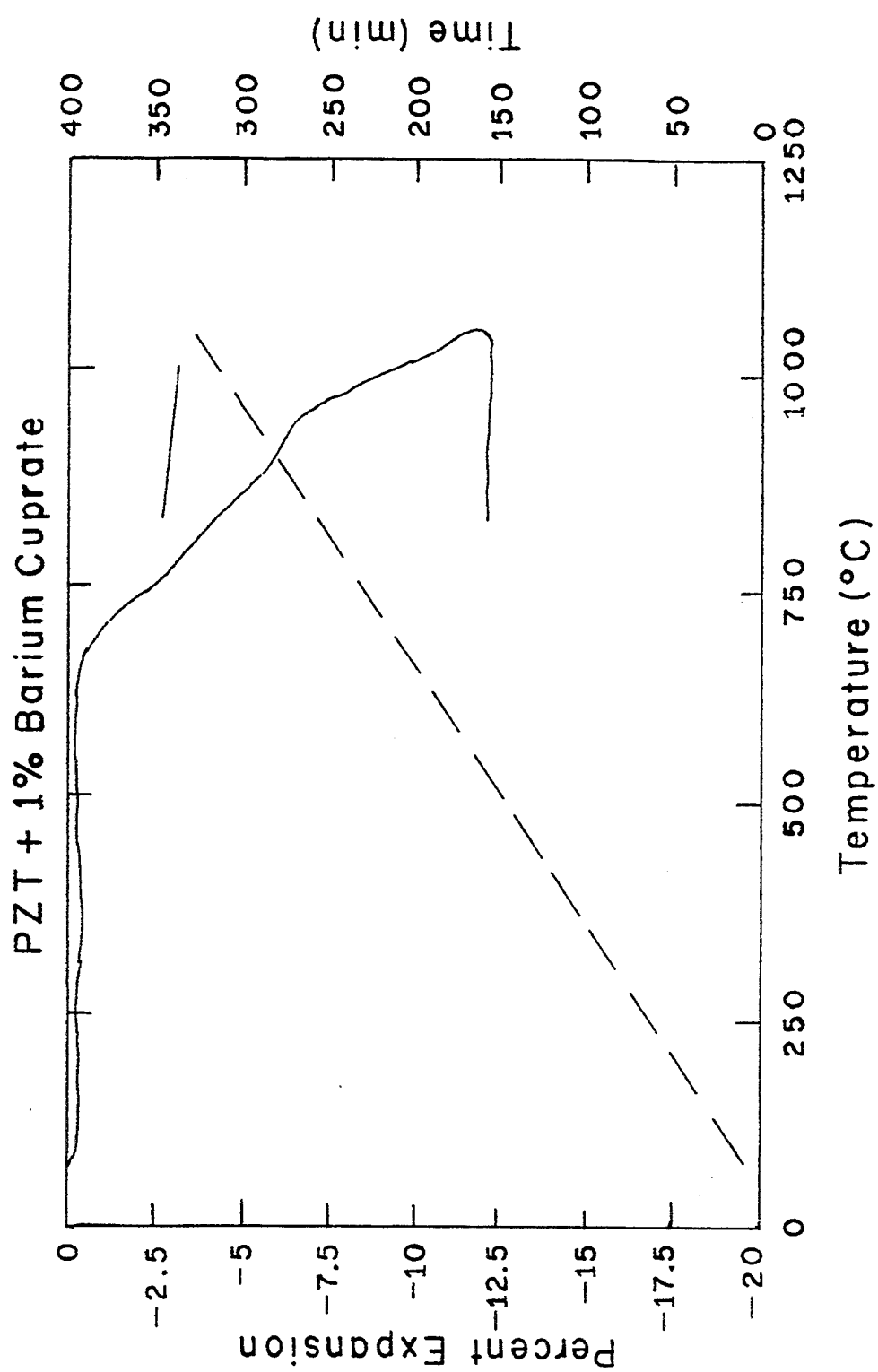
FIGS. 2–4 are curve graphs illustrating the shrinkage behavior or sintering behavior for fluxed PZT compositions containing 1%, 2% and 4%, respectively, of the present barium cuprate eutectic according to the present invention.
Figure 3:
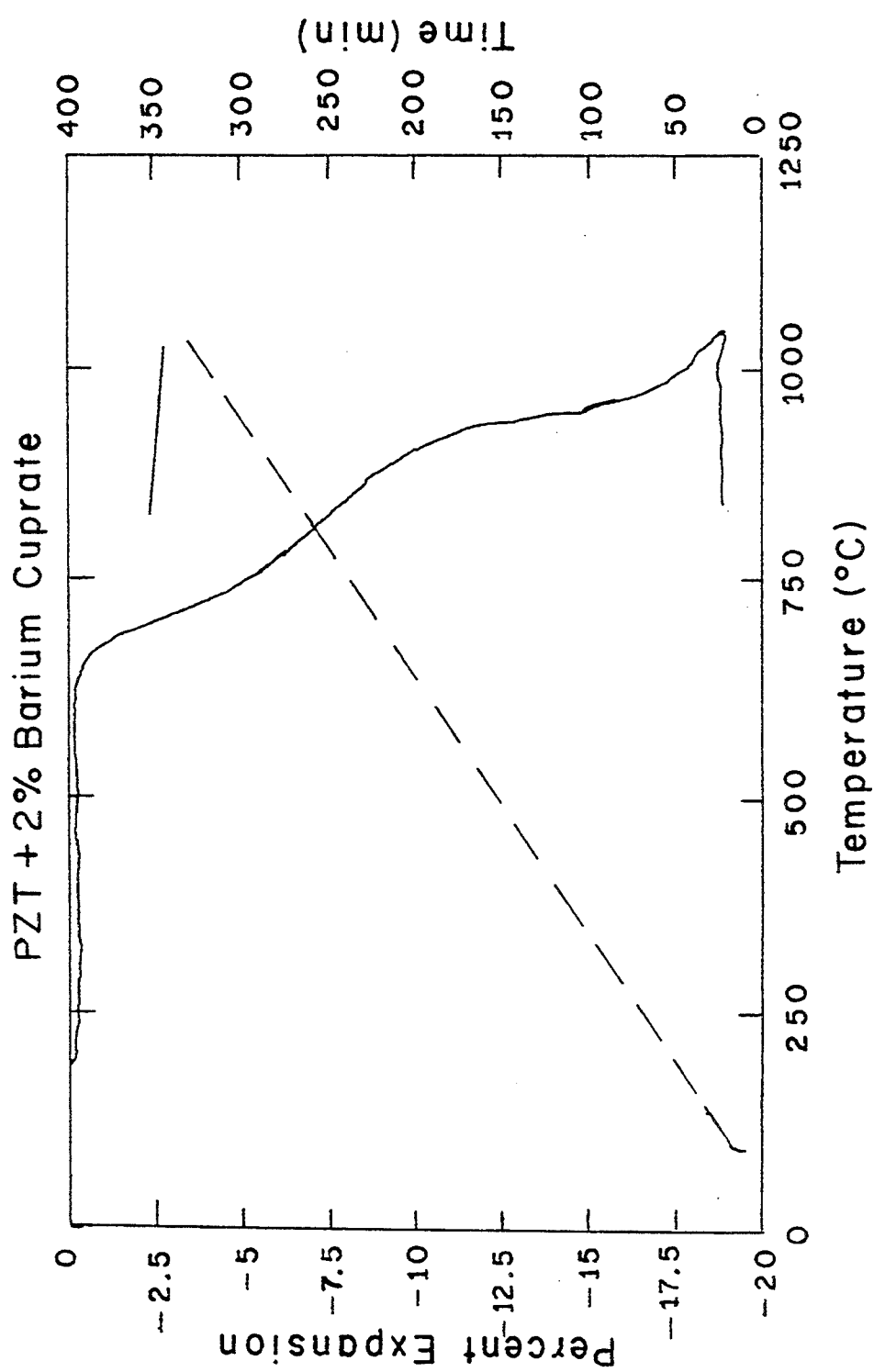
Figure 4:
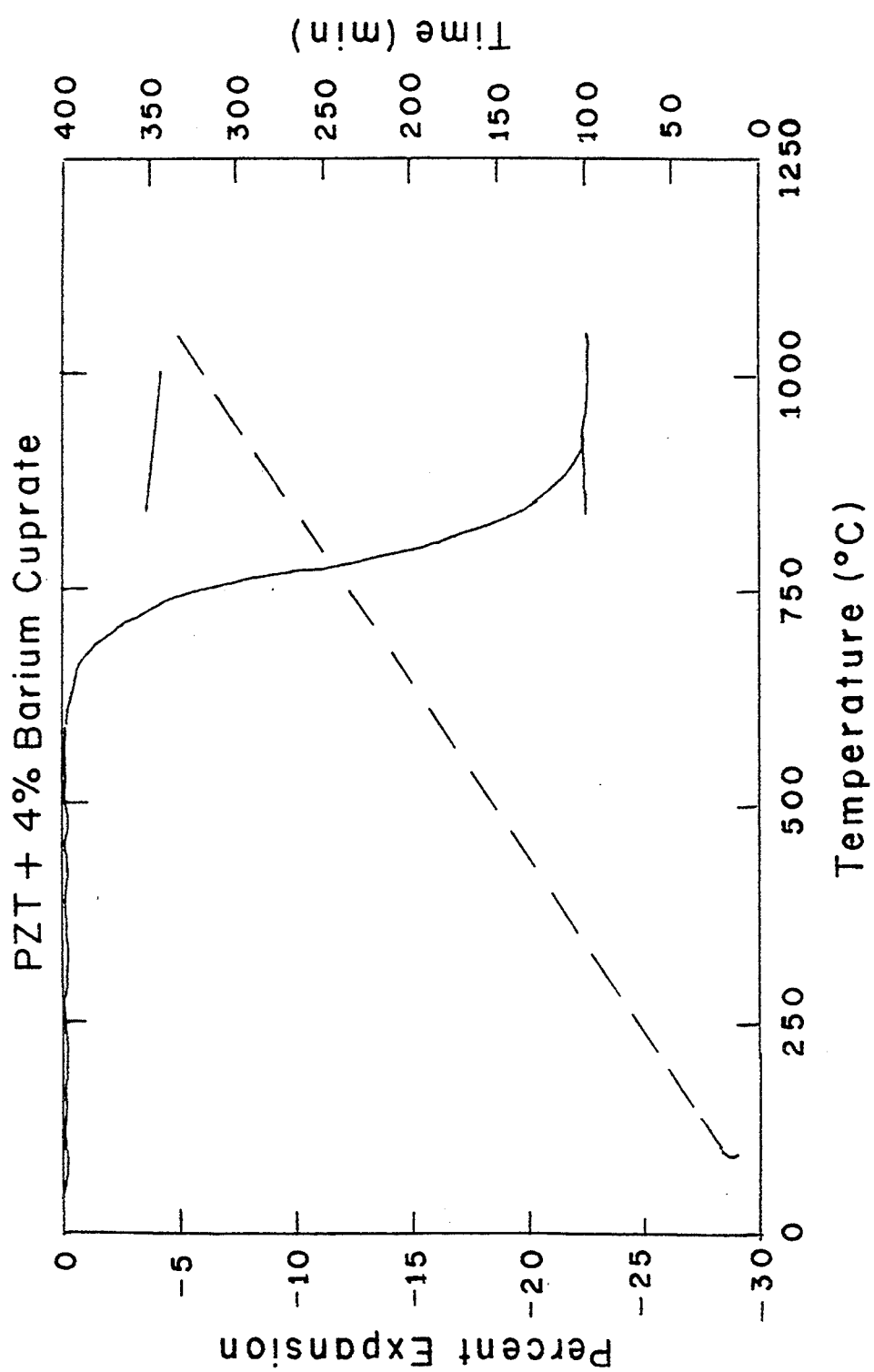

The effect of the flux addition on densification is strong. Although the binary phase diagram for a $BaO-CuO_x$ system shows the eutectic of the system occurring at 900° C., when added to PZT a liquid phase appears as early as 750° C. In small quantities (1%) the flux is inadequate for complete densification up to 1100° C., the shrinkage being only about 12%, as shown by FIG. 2. With 2% BC additions the shrinkage is increased to about 18% in two rapid, distinct steps as shown in FIG. 3. But even at 1100° C. the densification is incomplete. The 4% BC additions showed rapid, complete densification, with about 23% shrinkage, as early as 900 C. in one step, indicating an almost 100% liquid phase enhanced sintering, as shown by FIG. 4. The color of the PZT samples change from a yellow to pale green to black as the flux content is increased.

The fluxed samples were sintered at 900, 950 and 1000C. for 1, 10 and 30 hours in a slightly oxidizing atmosphere. For microstructural analysis, samples were polished to a 0.05 micron grit and the surface was observed in an optical and electron microscope before and after etching. The optical micrographs clearly indicate an even distribution of the second black phase, the residual flux. Samples sintered with greater soak times were observed to have smaller amounts of residual flux indicating a reaction of the flux with the PZT grains. The cation, $Ba^{+2}$ in the flux may be an insolvent substitution for the A-site10, $Pb^{+2}$, and the $Cu^{+2}$ from the flux may be a B-site acceptor dopant in PZT. Copper in $BaTiO_3$ is known to substitute for $Ti^{+4}$, raising the Curie point by about 3° C. per mole % CuO. It is therefore expected to behave similarly in PZT. Barium on the other hand is similar to $Sr^{+2}$ and $Ca^{+2}$, substituting for $Pb^{+2}$ and hence reducing the Curie temperature. This appears to explain the reduction in the Curie point as the percentage of flux is increased and as the soak time is increased.

The commercial soft PZT has essentially three different ions, $Sr^{+2}$, $La^{+3}$ and $Nb^{+5}$. Strontium is an isovalent, substitution, replacing $Pb^{+2}$ and lowering the Curie point by about 9.5° C. per atom% added, raising the dielectric constant and hence also raising the $d_{33}$ and electromechanical coupling without affecting the dissipation factor. Lanthanum goes to the A-site while Niobium goes to the B-site. Both cations cause A-site vacancies as verified by weight-loss studies. These additions tend to enhance the electromechanical coupling coefficients. This composition has a density of $7.4 \times 10^3$ $kg/m^3$ and a Curie point of about 200° C. The optimum firing condition is 1280° C. for 1 or 2 hours. Its dielectric constant and loss characteristics, between 175° to 230° C., at five frequencies, 0.1 kHz, 1 kHz, 10 kHz, 40 kHz and 100 kHz are shown in FIGS. 5 and 6. (all dielectric data has been taken under similar parameters and plotted on the same scale for ease in analysis).

To this composition 1%, 2%, 3%, 4%, 6%, 8% and 10% of the present barium cuprate flux was added. The dielectric constant and loss for samples fired at 950° C. for 1 hr is given in FIGS. 7 and 8 which also give the corresponding curves for the unfluxed PZT which was fired at 1280° C. The 1% and 2% BC samples have poor dielectric properties due to inadequate densification. Although the peak heights of the fluxed samples is lower than that of unfluxed PZT, the dielectric constant in the vicinity of room temperature ±50° C. is unaffected by >2% BC additions with only a very slight increase in the dielectric loss as the percentage of flux additions increase. FIGS. 7 and 8 show the dielectric constant and loss curves of all seven samples (commercial PZT 1280° C./1 hr and six fluxed samples fired at 950° C./1 hr) measured at 1 kHz, between −175° and 230° C. overlapped on the same scale for easy analysis. PZT fluxed with 4% BC shows the maximum peak height. This is due to the lower porosity and higher density when compared to the 2% BC samples. Higher additions of the low K flux tend to dilute the peak. As the percentage of flux is increased, a broadening of the peak and reduction in Curie point is observed. This is due to the $Ba^{+2}$ entering the PZT lattice. The losses are fairly stable for all compositions between −90° to 200° C. At temperatures below −90° to 200° C. At low temperatures below the Curie point the main contribution to the losses are the domains and their defects. At temperatures below −90° C. the domains are affected by the flux additions causing noticeable increases in the losses at these low temperatures.

The fluxed samples were also fired at 950C. with varied soak times of 10 hours and 30 hours. The 2% BC samples tend to change substantially due to an optimization of the physical properties. The losses are stable between $-100°$ to 190° C. and increase below $-100°$ C. and above 190° C. due to contributions from the domains and increased conduction, respectively. For 8% and greater additions of the flux, soaked for 30 hrs, there was an appreciable increase in conduction causing large losses. This indicates that higher temperatures and longer soak times may cause adverse reactions with "over" fluxed samples. The optimum flux addition for this soft PZT, lies between 2 to 4%.

The piezoelectric properties of the fluxed compositions are decreased to some degree. The causes for these decease are complex due to the five different cation additives and the varied microstructure. This is further substantiated by the lack of grain growth. The fluxed sample having the optimum $d_{33}$ was a 2% BC addition sintered at 950° for 30 hrs.

For a preliminary cofiring study of the fluxed PZT, an 11% Pd-89% Ag electrode ink containing a binder was coated on discs of PZT with 2% and 4% BC additions. The binder burnout was done in a conventional furnace at 550° C. The electroded samples were fired in a fast fire furnace at 950° C. for 30 minutes. The dielectric data is shown in FIGS. 9, 10, 11 and 12. The dielectric data is comparable unfluxed to PZT fired at 1280° C., but there is an increase in the losses requiring optimization of the sintering conditions and ink compositions, such as by the addition of conventional dopants.

$MnO_2$ is a known metal oxide dopant additive to reduce the dielectric losses in PZT ceramic compositions, as disclosed by the Cheng et al. reference referred to hereinbefore. Hence a test sample was made with the fluxed composition showing the greatest dielectric loss, namely the 10% composition for which the dielectric constant and loss curves are shown in FIGS. 7 and 8 of the drawing. To the sample fluxed with 10% BC, 0.5% $MnO_2$ was added and fired at 950 C. for 1, 10 and 30 hrs. FIGS. 13 and 14 show the effect of $MnO_2$ on the samples fired for 10 hours. The dielectric constant is unaffected except a "pinching" effect indicating no dispersion effects. The loss data indicates that $Mn_2$ is an excellent aid in reducing the losses for this PZT-barium cuprate system. Other conventional metal oxide dopants can also be used in place of manganese oxide.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. Process for lowering the sintering temperature of lead zirconium titanate (PZT) piezoelectric ceramic compositions, containing about 52% lead zirconate and 48% lead titanate, to 900°–950° C., without substantially reducing the dielectric constant of the composition or substantially increasing its dielectric loss properties, which comprises adding to the PZT a small effective amount of a barium cuprate fluxing agent in the form of a eutectic flux mixture comprising copper oxide and barium oxide and sintering the composition at a temperature up to about 1100° C. to produce substantial densification.

2. Process according to claim 1 in which said effective amount is between about 2 wt % and 10 wt % of the composition.

3. Process according to claim 1 in which said effective amount is about 4 wt % of the composition.

4. Process according to claim 1 in which said PZT is a PZT composition containing a small effective amount of a dopant to reduce the dielectric losses of the composition.

5. Process according to claim 4 in which said dopant comprises manganese dioxide.

6. Process according to claim 4 in which said PZT composition contains about 0.5 wt % of manganese oxide as the dopant and is sintered with about 4 wt % of BaO-CuO eutectic fluxing agent.

7. Process according to claim 1 which comprises cofiring layers of said sintered PZT ceramic composition in association with electrode layers at a temperature below about 1000° C., at which said electrode layers are not reactive with said ceramic layers, to form an electroded ceramic component having good dielectric properties.

8. Process according to claim 7 in which said electrode layers comprise a minor wt % of palladium and a major wt % of silver.

9. Process for lowering the sintering temperature of lead zirconium titanate (PZT) piezoelectric ceramic compositions, containing about 52% lead zirconate and 48% lead titanate, to 900°–950° C., without substantially reducing the dielectric constant of the composition or substantially increasing its dielectric loss properties, which comprises adding to the PZT between about 2 wt % and 10 wt % of a barium cuprate fluxing agent in the form of a eutectic flux mixture comprising copper oxide and barium oxide, and sintering the composition at a temperature up to about 1100° C. to produce substantially densification.

10. Process according to claim 9 in which said PZT is a PZT composition containing a small effective amount of a dopant to reduce the dielectric losses of the composition.

11. Process according to claim 10 in which said dopant comprises manganese dioxide.

12. Process according to claim 11 in which said PZT composition contains about 0.5 wt % of manganese oxide as the dopant and is sintered with about 4 wt % of baO—CuO eutectic fluxing agent.

* * * * *